United States Patent
Kim et al.

(10) Patent No.: US 7,988,122 B2
(45) Date of Patent: Aug. 2, 2011

(54) VIBRATION CONTROL PEDESTAL AND INSTALLATION METHOD THEREOF

(75) Inventors: Seok-Youn Kim, Gyeonggi-do (KR); Jung-Sung Hwang, Gyeonggi-do (KR); Ho-Young Lee, Gyeonggi-do (KR); Do-Hyun Kwun, Gyeonggi-do (KR); Jung-Shik Heo, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 887 days.

(21) Appl. No.: 11/937,384

(22) Filed: Nov. 8, 2007

(65) Prior Publication Data

US 2008/0174057 A1  Jul. 24, 2008

(30) Foreign Application Priority Data

Jan. 22, 2007  (KR) ................ 10-2007-0006620

(51) Int. Cl.
*F16M 1/00* (2006.01)
(52) U.S. Cl. ............ 248/638; 248/637; 52/292
(58) Field of Classification Search .......... 248/637, 248/638, 678, 679, 346.01; 52/292, 294, 52/167.1, 220.3, 223.7, 299, 263; 405/229, 405/232, 233, 238, 237
See application file for complete search history.

(56) References Cited

U.S. PATENT DOCUMENTS

| | | | | |
|---|---|---|---|---|
| 1,321,213 A * | 11/1919 | Johnson | ............................ | 52/666 |
| 2,426,477 A * | 8/1947 | Walton | ........................... | 405/218 |
| 2,971,295 A * | 2/1961 | Reynolds | ..................... | 52/223.7 |
| 3,495,371 A * | 2/1970 | Mitchell, Jr. | ................. | 52/653.1 |
| 3,890,750 A * | 6/1975 | Berman et al. | ............... | 52/127.3 |
| 3,918,222 A * | 11/1975 | Bahramian | ................... | 52/223.7 |
| 4,324,037 A * | 4/1982 | Grady, II | .......................... | 29/469 |
| 4,335,557 A * | 6/1982 | Morton | ....................... | 52/745.05 |
| 4,649,675 A * | 3/1987 | Moldovan et al. | ............... | 52/27 |
| 4,922,264 A * | 5/1990 | Fitzgerald et al. | ............. | 343/878 |
| 5,617,599 A * | 4/1997 | Smith | .............................. | 14/73 |
| 5,625,985 A * | 5/1997 | Johnson | .......................... | 52/177 |
| 5,971,347 A * | 10/1999 | Tsai et al. | ..................... | 248/618 |
| 6,050,038 A * | 4/2000 | Fey et al. | ..................... | 52/223.7 |
| 7,131,239 B2 * | 11/2006 | Williams | .................... | 52/169.5 |
| 7,546,715 B2 * | 6/2009 | Roen | .......................... | 52/506.05 |

FOREIGN PATENT DOCUMENTS

| | | |
|---|---|---|
| JP | 2000-170362 | 6/2000 |
| JP | 2001-146812 | 5/2001 |
| JP | 2001-238485 | 8/2001 |
| KR | 10-0706870 | 4/2007 |

OTHER PUBLICATIONS

English language abstract of Japanese Publication No. 2000-170362.
English language abstract of Japanese Publication No. 2001-146812.

* cited by examiner

*Primary Examiner* — Kimberly Wood
(74) *Attorney, Agent, or Firm* — Volentine & Whitt, PLLC

(57) ABSTRACT

A vibration control pedestal and an installation method thereof are disclosed, including a method for reducing particles and vibrations while moving equipment, including semiconductor equipment, from one vibration control pedestal to another. The vibration control pedestal includes an equipment support body having at least two equipment support cells. A cell connection unit passes through side surfaces of the equipment support cells and connects the equipment support cells to each other. A bottom structure installed under the equipment support body braces the equipment support body.

13 Claims, 7 Drawing Sheets

VIBRATION CONTROL PEDESTAL AND INSTALLATION METHOD THEREOF

CROSS-REFERENCE TO RELATED APPLICATION

This application claims priority from Korean Patent Application No. 2007-0006620, filed Jan. 22, 2007, the disclosure of which is incorporated herein by reference in its entirety.

BACKGROUND OF INVENTION

1. Technical Field

The present invention relates to a vibration control pedestal and an installation method thereof, and more particularly, to a vibration control pedestal for semiconductor equipment used to install semiconductor equipment and an installation method thereof.

2. Discussion of the Related Art

Generally, a plurality of semiconductor equipment for performing unit processes such as a photolithography process, an etching process, a thin film deposition process, and so on, are used in a semiconductor manufacturing line for processing a wafer and manufacturing a semiconductor device.

Since most semiconductor equipment involves precise processes, they are very sensitive to vibrations or other environmental effects transmitted from the exterior. For example, photolithography equipment, which is used for performing intricate photolithography processes, requires significant precision when transferring a semiconductor circuit pattern drawn on a photo mask substrate onto a wafer. It is for this reason that photolithography equipment is especially sensitive to vibrations transmitted from the exterior.

When semiconductor equipment, including the photolithography equipment, is installed in a semiconductor manufacturing line, the semiconductor equipment is commonly installed on a vibration control pedestal for partially absorbing and attenuating external vibrations, rather than being directly installed on a bottom surface of the semiconductor manufacturing line. In other words, the vibration control pedestal is previously installed at a particular position; and then, the semiconductor equipment is installed on the vibration control pedestal.

The conventional vibration control pedestal installed at the semiconductor manufacturing line supports single manufacturing equipment using a single body structure that is not disassembled. Therefore, when the semiconductor equipment is moved, it is impossible to move the already installed vibration control pedestal due to its size and structure. Eventually, when the semiconductor equipment is moved, the already installed vibration control pedestal is dismantled, and a new vibration control pedestal is installed at a position proximate to where the semiconductor equipment is re-installed. In this case, particles and vibrations may be generated in the semiconductor manufacturing line due to dismantlement of the vibration control pedestal, which negatively affects the semiconductor manufacturing environment. Furthermore, installation of a new vibration control pedestal incurs additional costs and can be a time consuming operation. Accordingly, a need remains for an improved vibration control pedestal and installation method.

SUMMARY OF THE INVENTION

Therefore, the present invention is directed to provide a vibration control pedestal and an installation method thereof capable of readily installing the pedestal and enabling assembly and disassembly of the pedestal. Another object of the present invention is to provide a vibration control pedestal for semiconductor equipment capable of readily installing the pedestal and enabling assembly and disassembly of the pedestal while reducing vibration and particles.

One embodiment of the present invention includes a vibration control pedestal comprising a bottom structure comprising a plurality of support beams; an equipment support body having at least two equipment support cells, the support beams being structured to brace the equipment support body; and at least one cell connection unit extending laterally through side surfaces of the at least two equipment support cells to couple the at least two equipment support cells to each other.

Another embodiment of the present invention includes a method for reducing particles and vibrations while moving semiconductor equipment from one vibration control pedestal to another, comprising preparing a first bottom structure; releasably securing at least two rectangular support cells with planar surfaces to the first bottom structure; laterally extending at least one cell connection unit through side surfaces of the at least two support cells to couple the at least two support cells to each other; placing the semiconductor equipment on the at least two support cells; releasing the at least two support cells from the first bottom structure; and moving the at least two support cells to a second bottom structure while maintaining the placement of the semiconductor equipment on the at least two support cells.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
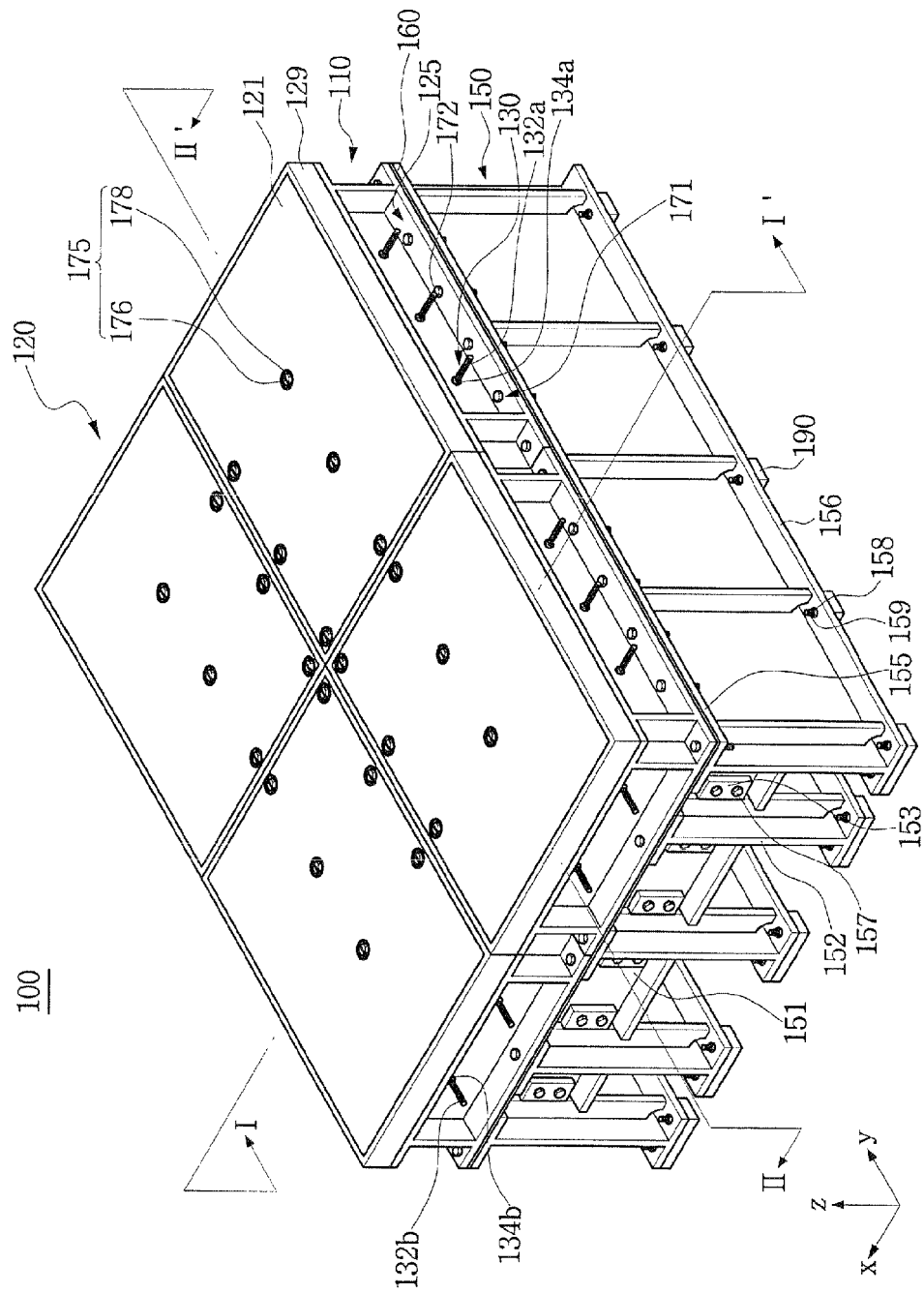
FIG. 1 is a perspective view of a vibration control pedestal in accordance with an exemplary embodiment of the present invention.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

Figure 2:
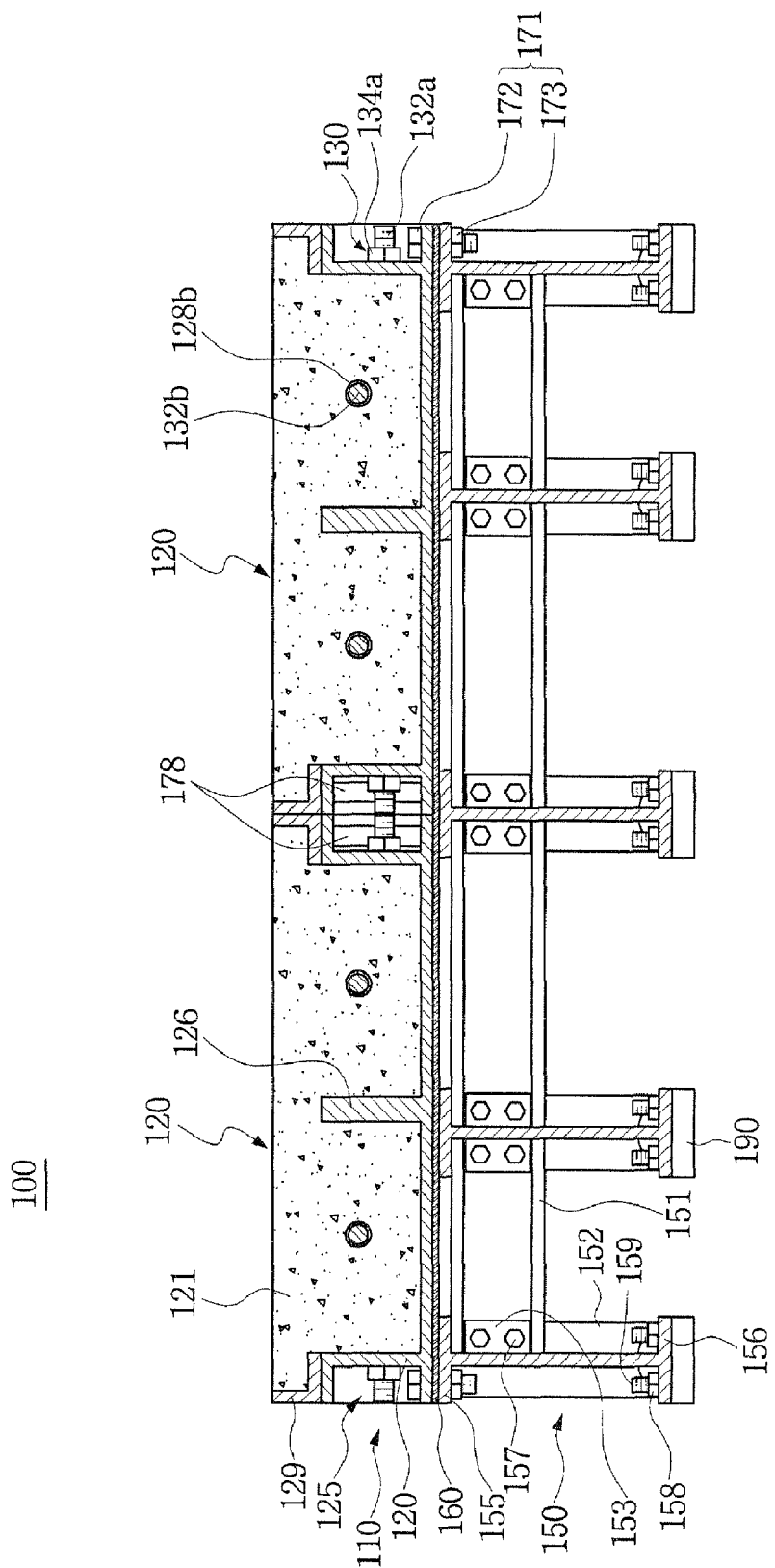
FIG. 2 is a cross-sectional view taken along the line I-I' of FIG. 1.
Figure 3:
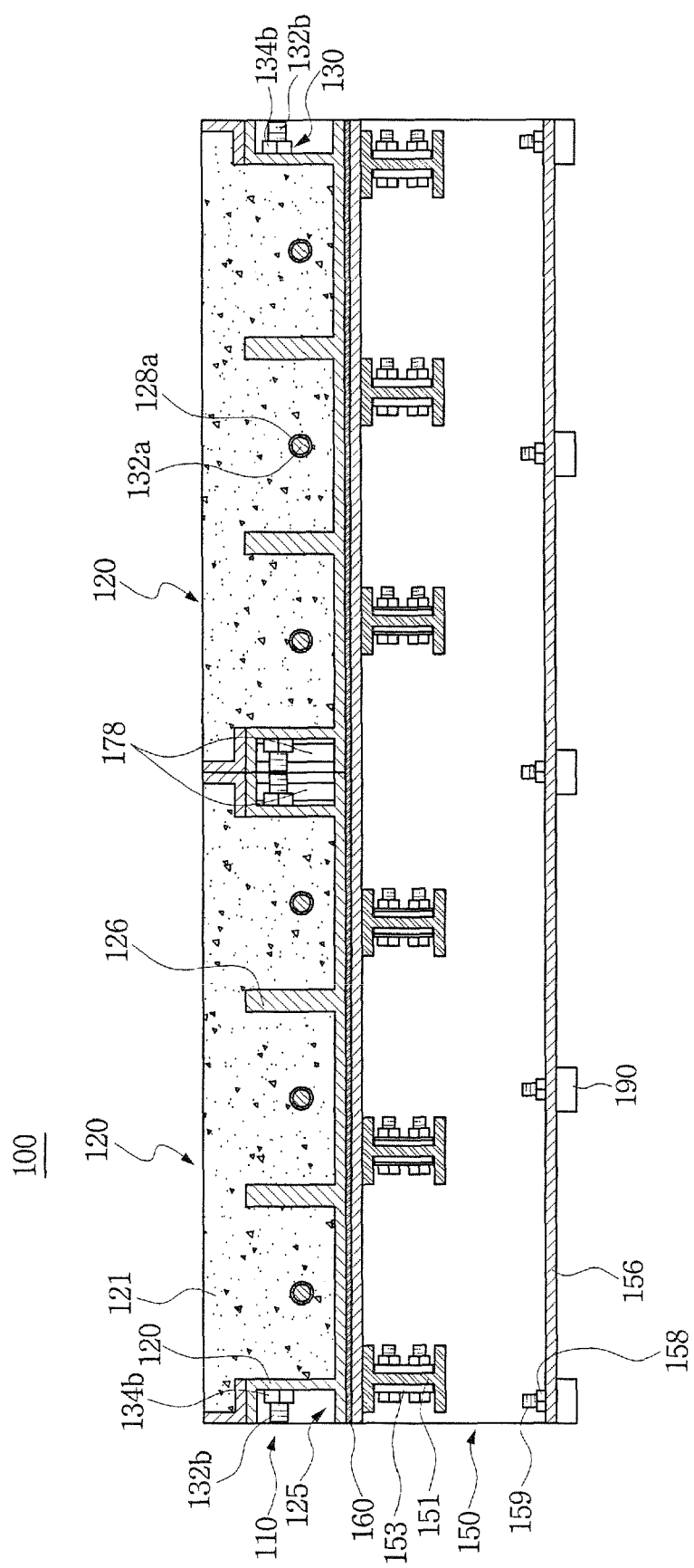
FIG. 3 is a cross-sectional view taken along the line II-II' of FIG. 1.
Figure 4:
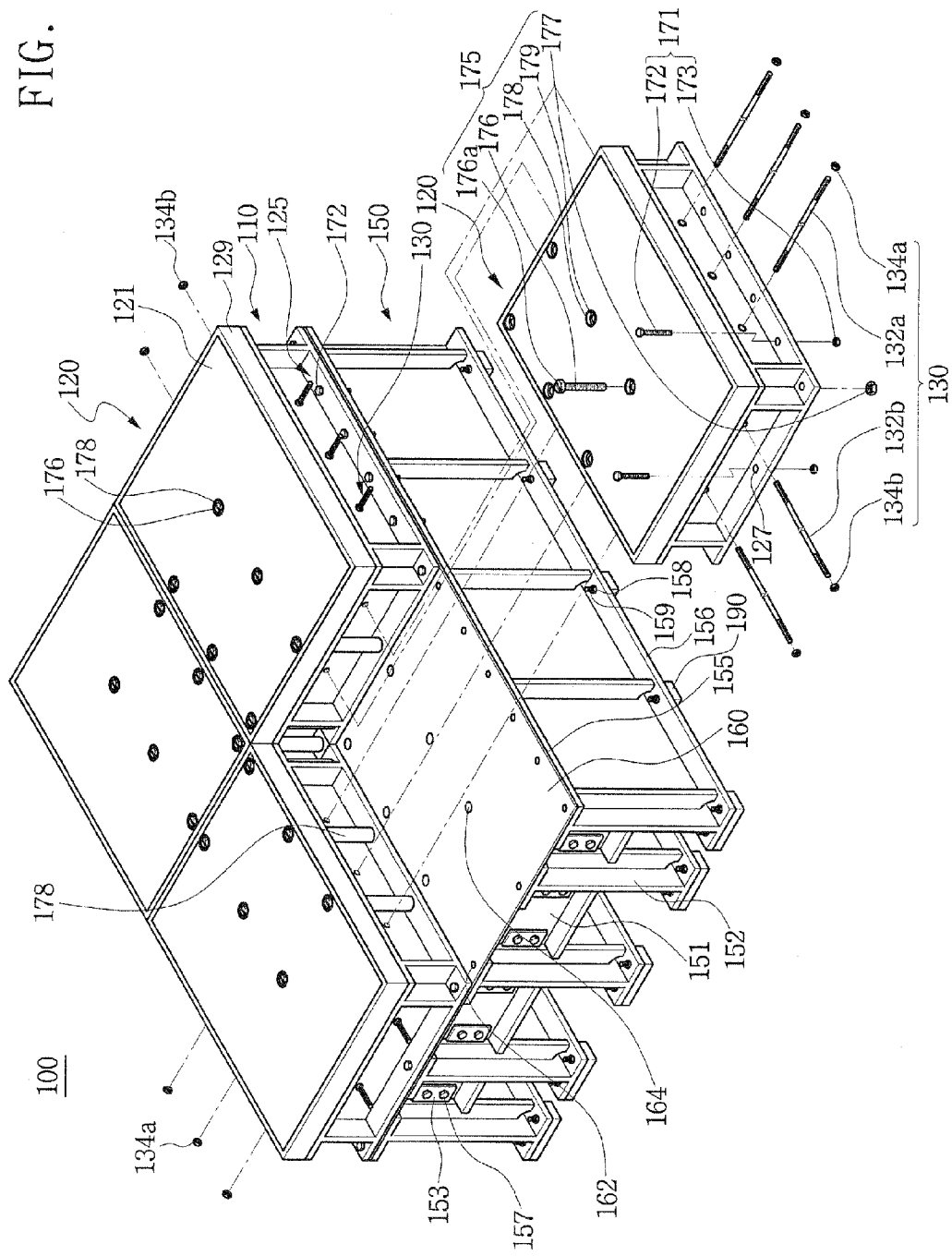
FIG. 4 is an exploded perspective view of the vibration control pedestal of FIG. 1.
Figure 5:
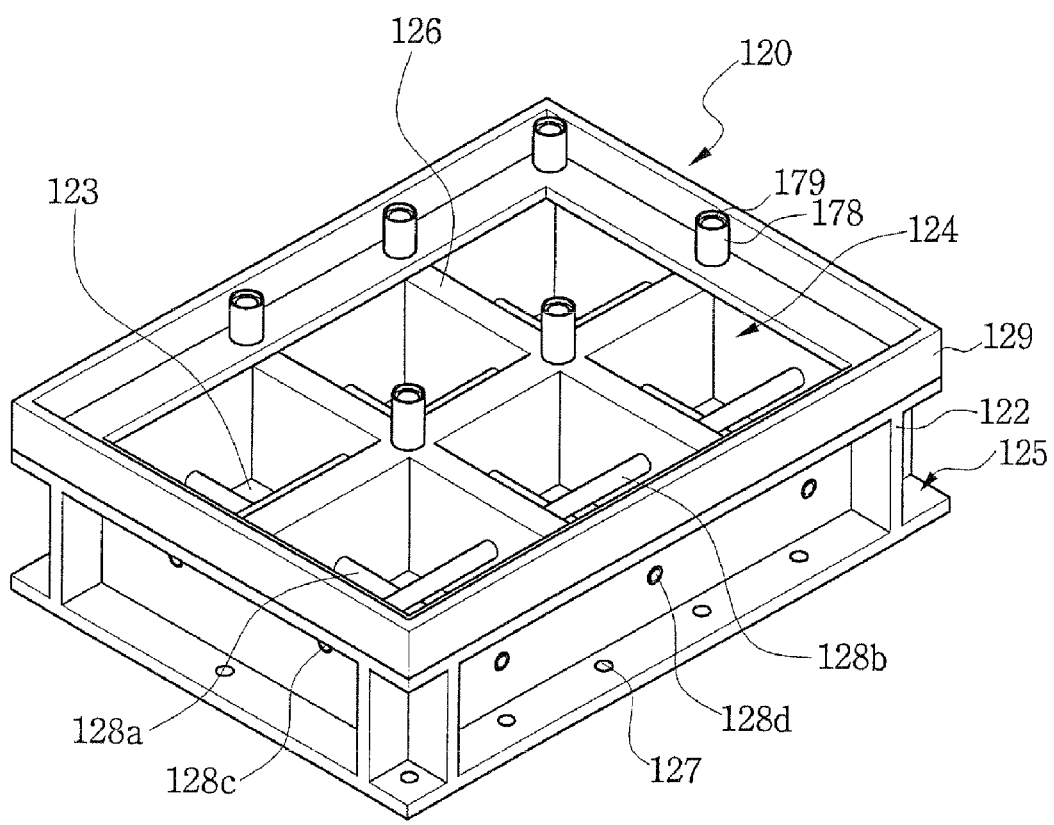
FIG. 5 is a perspective view of a skeleton of an equipment support cell used in an embodiment of the vibration control pedestal of the present invention.
Figure 6:
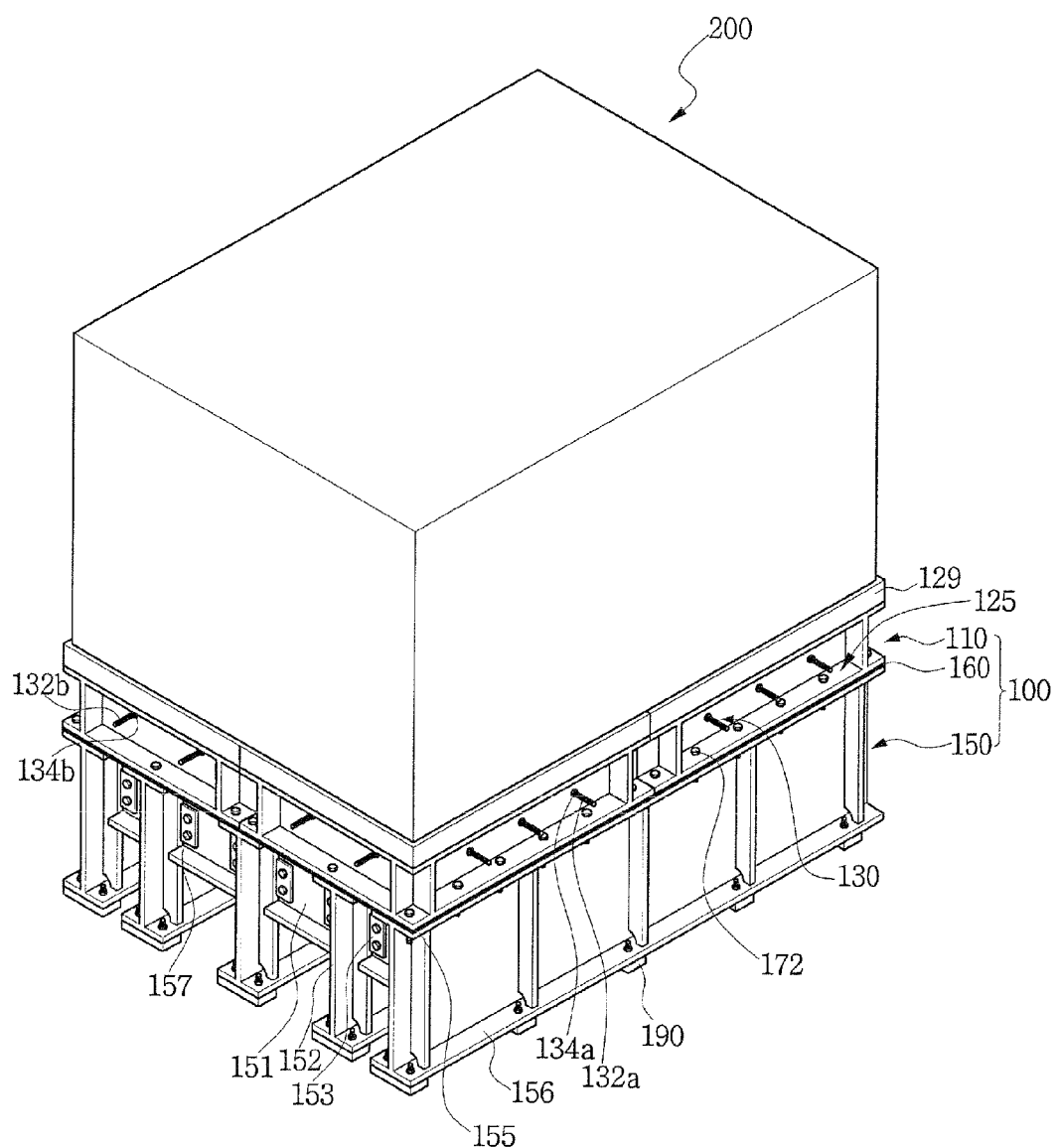
FIG. 6 is a perspective view of the vibration control pedestal of the present invention, in which semiconductor equipment is installed.

FIG. 1 is a perspective view of a vibration control pedestal in accordance with an exemplary embodiment of the present invention. FIG. 2 is a cross-sectional view taken along the line I-I' of FIG. 1. FIG. 3 is a cross-sectional view taken along the line II-II' of FIG. 1. FIG. 4 is an exploded perspective view of the vibration control pedestal of FIG. 1. FIG. 5 is a perspective view of a skeleton of an equipment support cell used in an embodiment of the vibration control pedestal of the present invention. And FIG. 6 is a perspective view of the vibration control pedestal of the present invention, in which semiconductor equipment is installed.

As shown in FIGS. 1 to 6, a vibration control pedestal in accordance with an exemplary embodiment of the present invention includes a vibration control pedestal 100 installed under semiconductor equipment 200 to support the semiconductor equipment in an assembled and disassembled manner. For example, the vibration control pedestal 100 in accordance with the embodiments of the present invention may be used as a vibration control pedestal for a variety of semiconductor equipment 200, including for example, photolithography equipment. Persons with skill in the art will recognize that the vibration control pedestal 100 may be used with precision equipment of different sorts which require very accurate operation, as well as the semiconductor equipment 200.

Specifically, the vibration control pedestal 100 in accordance with an exemplary embodiment of the present invention includes an equipment support body 110 for supporting the equipment 200, a bottom structure 150 installed under the equipment support body 110, a connection plate 160 interposed between the equipment support body 110 and the bottom structure 150, and a fixing unit for fixing the equipment support body 110, the bottom structure 150, and the connection plate 160 to each other. The equipment support body 110 includes at least two rectangular equipment support cells 120, each having a planar surface, for directly supporting equipment 200 (e.g., semiconductor equipment) placed on the equipment support cells. A cell connection unit 130 may pass through side surfaces of the equipment support cells 120 to couple the equipment support cells 120 to each other.

The equipment support cell 120 may have a rectangular panel 122 in which concrete 121 is cast, and a connection pipe (e.g., 128a and 128b) installed to pass through the panel 122 in a lateral direction thereof. The cell connection unit 130 may couple the equipment support cells 120 through the medium of the connection pipe installed to pass through the panel 122. The connection pipe may include a first connection pipe 128a passing through the panel 122 in a width direction, and a second connection pipe 128b passing through the panel 122 in a length direction. In this embodiment, the cell connection unit 130 may couple the equipment support cells 120 to each other in a width direction through the medium of the first connection pipe 128a installed in a width direction of the panel 122, or may couple the equipment support cells 120 to each other in a length direction through the medium of the second connection pipe 128b installed in a length direction of the panel 122. Eventually, the equipment support cells 120 may be coupled in a lattice shape as shown in FIG. 1 using the connection pipes 128a and 128b and the cell connection unit 130 installed therein in width and length directions.

More specifically, a concrete casting part 124, in which the concrete 121 is cast, may be provided at a center of the panel 122, and a bracket part 125 for fixing the panel 122 to the bottom structure 150 may be provided at a periphery of the panel 122. In addition, an upper part of the panel 122 may be opened to introduce the concrete 121 into its center part, and a sealing plate 123 may be installed at a lower part of the panel 122 to support the introduced concrete 121. Therefore, the concrete 121 may be introduced into the upper part of the panel 122 and cured in the concrete casting part 124 as the center part of the panel 122. Meanwhile, partition walls 126 may be installed in the panel 122 to divide an inner space of the panel 122 and reinforce strength of the panel. In this embodiment, the concrete 121 may be introduced into the inner spaces of the panel 122, which are divided by the partition walls 126, and cured therein. In addition, a fence 129 having a predefined height may be further installed at an upper periphery of the panel 122 along the periphery of the panel 122. In this embodiment, the concrete 121 may be further cast into the upper part of the panel 122, i.e., the inner space defined by the fence 129, as well as the inner part of the panel 122. As a result, since the concrete 121 cast into the panel 122 has a greater thickness, and strength of the panel 122 is further increased. Reference numeral 127 designates boltholes formed at the bracket part 125 into which periphery fixing bolts 172 may be inserted, which are to be described.

As described above, the cell connection unit 130 may include an insert rod (e.g., 132a and 132b) for connecting the equipment support cells 120 to each other and inserted into the connection pipe (e.g., 128a and 128b). Fixing members (e.g., 134a and 134b) may be fastened to both ends of the insert rod to fix the insert rod to the panel 122. The insert rod may be a stud bolt having threaded parts formed at both of its ends. The fixing members may be nuts threadedly engaged at both ends with the stud bolt. As such, when the equipment support cells 120 are to be connected to each other, an operator can insert the stud bolt into the connection pipe previously installed at the panel 122. The operator may then fasten the nuts to both ends of the stud bolt, thereby connecting the equipment support cells 120 to each other. The cell connection unit 130 functions to couple the equipment support cells 120 to each other through the medium of the connection pipe.

The connection pipe may include a first connection pipe 128a passing through the panel 122 in a width direction and a second connection pipe 128b passing through the panel 122 in a length direction. The insert rod may also include a first direction insert rod 132a inserted into the first connection pipe 128a and a second direction insert rod 132b inserted into the second connection pipe 128b. The fixing member may include a first fixing member 134a inserted into the first direction insert rod 132a and a second fixing member 134b inserted into the second direction insert rod 132b. Therefore, the cell connection unit 130 may couple the equipment support cells 120 to each other through the medium of the first connection pipe 128a of the panel 122 in a width direction, or couple the equipment support cells 120 to each other through the medium of the second connection pipe 128b of the panel 122 in a length direction. Reference numeral 128d designates a hole of the first connection pipe 128a into which the first direction insert rod 132a may be inserted. Similarly, reference numeral 128c designates a hole of the second connection pipe 128b into which the second direction insert rod 132b may be inserted.

The bottom structure 150, formed of a lattice beam structure, may be installed under the equipment support body 110 to brace the equipment support body 110. That is, the bottom structure 150 includes a plurality of first support beams 152 parallelly disposed in a first direction, a plurality of second support beams 151 passing through side surfaces of the first support beams 152 to be perpendicularly disposed to the first support beams 152, and fastening members 157 for fastening the first support beams 152 to the second support beams 151.

Specifically, the first support beam 152 may be installed at a bottom surface on which the equipment 200 is installed (e.g., a bottom surface of a clean room in which semiconductor equipment is installed). The first support beam 152 may include a bottom support part 156 opposite to the bottom surface, and a plate support part 155 opposite to the connection plate 160. A fixing hole (not shown) may be formed at the bottom support part 156. An operator may fix the bottom support part 156 to the bottom surface through the medium of the fixing hole using a fixing bolt 159 and a fixing nut 158. In addition, an insert hole (not shown) may also be formed at the plate support part 155. Therefore, an operator may fix the plate support part 155 to the connection plate 160 through the insert hole using a periphery fixing bolt 172 and a periphery fixing nut 173, which are to be described. Reference numeral 190 designates a support plate for supporting a lower part of the bottom support part 156 into which the fixing bolt 159 and the fixing nut 158 may be inserted. The support plate 190 may be formed of a vibration control material such as a rubber, or a material including a vibration control material such as a rubber.

Further, the first support beam 152 may include a beam connection plate 153 for connecting the first support beam 152 to the second support beam 151. In this embodiment, when the first support beam 152 is fastened to the second support beam 151, the fastening member 157 can fasten the first support beam 152 to the second support beam 151 through the medium of the beam connection plate 153. Here, the fastening member 157 may be a coupling bolt.

The connection plate 160 may be interposed between the equipment support body 110 and a bottom structure 150 to more securely couple the equipment support body 110 with the bottom structure 150. The connection plate 160 may have a flat plate with a certain thickness and a size sufficient to cover the entire upper surface of the bottom structure 150. In addition, the connection plate 160 may have a plurality of holes for coupling the equipment support body 110 with the bottom structure 150. In one embodiment, the connection plate 160 may have edge holes 162 formed at its periphery with associated fixing periphery fixing bolts 172. The connection plate 160 may also have at least one center hole 164 with at least one associated center fixing bolt, which are to be described.

A fixing unit functions to fix the equipment support cells 120 of the equipment support body 110 to the connection plate 160 and the bottom structure 150, respectively. Specifically, the fixing unit may include a periphery fixing unit 171 for fixing the periphery of the equipment support cell 120 to portions of the connection plate 160 and the bottom structure 150 corresponding thereto, and a center fixing unit 175 for fixing a center part of the equipment support cell 120 to portions of the connection plate 160 and the bottom structure 150. Therefore, the equipment support body 110, formed of a plurality of equipment support cells 120, can be more securely fixed to the connection plate 160 and the bottom structure 150 using the fixing unit. Here, the periphery fixing unit 171 may include periphery fixing bolts 172 passing through the periphery of the equipment support cell 120, portions of the connection plate 160, and the bottom structure 150 corresponding thereto in a vertical direction. Periphery fixing nuts 173 may be fastened to the periphery fixing bolts 172 to fix the periphery fixing bolts 172 to the bottom structure 150, and so on. In addition, the center fixing unit 175 may include an insert pipe 178 through which a center fixing bolt 176 may vertically pass through the equipment support cell 120. Additionally, a center fixing bolt 176 may vertically pass through portions of the connection plate 160 and the bottom structure 150 corresponding to the equipment support cell 120 through the insert pipe 178. A center fixing nut 177 may be fastened to the center fixing bolt 176 to fix the center fixing bolt 176 to the bottom structure 150, and so on. Reference numeral 176a designates a head part of the center fixing bolt 176. Reference numeral 179 designates a step formed in the insert pipe 178, by which the head part 176a of the center fixing bolt 176 may be situated.

Hereinafter, a method of installing a vibration control pedestal 200 in accordance with an exemplary embodiment of the present invention will be described in detail with reference to FIG. 7.

Figure 7:
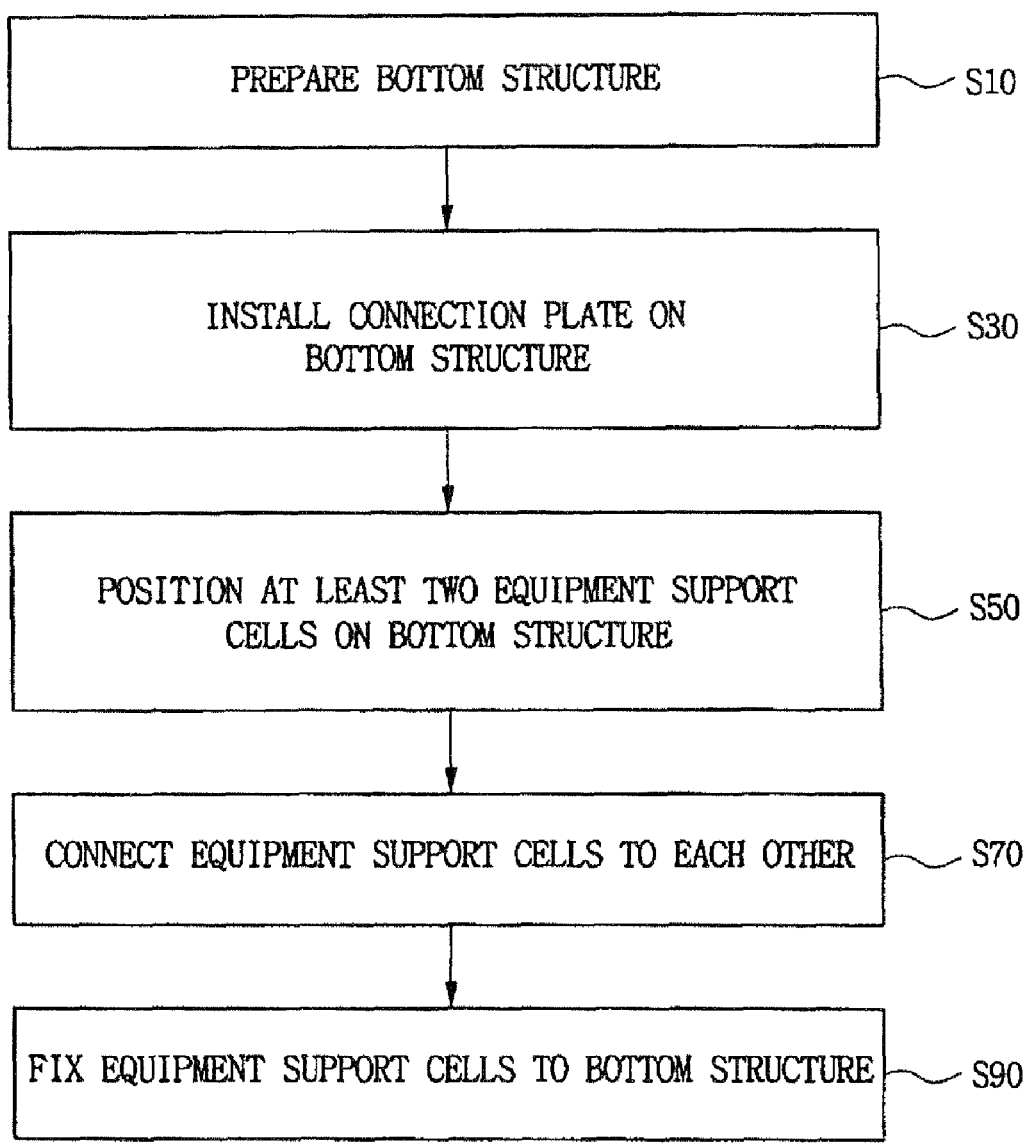
FIG. 7 is a flowchart showing a method of installing a vibration control pedestal in accordance with the present invention.

FIG. 7 is a flowchart showing a method of installing a vibration control pedestal in accordance with an exemplary embodiment of the present invention. First, an operator may prepare a bottom structure 150 (S10), and may fix the bottom structure 150 to a bottom surface on which equipment 200 are to be installed. Next, when the bottom structure 150 is prepared, a connection plate 160 may be installed on the bottom structure 150 (S30), and at least two equipment support cells 120 may be disposed on the connection plate 160 (S50). At this time, the at least two equipment support cells 120 may be directly positioned on the bottom structure 150.

Then, the operator may couple the equipment support cells 120 to each other using a cell connection unit 130 passing side surfaces of the equipment support cells 120 (S70). The operator may continuously insert the insert rod into the connection pipe of the adjacent equipment support cells 120, and then fasten fixing members to both ends of the insert rod, thereby connecting the adjacent equipment support cells to each other. As shown in FIG. 1, when the equipment support cells 120 are disposed in a lattice manner, the operator may first couple the equipment support cells 120 in one direction, i.e., a width or length direction, using the cell connection unit 130; and then, the operator may connect the equipment support cells 120 in the other direction, thereby completing connection of the equipment support cells 120.

Next, when equipment support cells 120 are connected, the operator may fix the equipment support cells 120 to the connection plate 160 and the bottom structure 150 using the fixing units (S90), thereby completing installation of the vibration control pedestal 200. That is, the operator may fix the periphery of the equipment support cell 120 to portions of the connection plate 160 and the bottom structure 150 corresponding thereto using a periphery fixing unit 171, and may fix the center of the equipment support cell 120 to portions of the connection plate 160 and the bottom structure 150 corresponding thereto using a center fixing unit 175.

As can be seen from the foregoing, an equipment support body for a vibration control pedestal in accordance with an exemplary embodiment of the present invention includes at least two equipment support cells and a cell connection unit for connecting the equipment support cells to each other. Therefore, it is possible to readily install the vibration control pedestal, and if necessary, readily assemble and disassemble the vibration control pedestal. As a result, when equipment installed on the vibration control pedestal is moved, the vibration control pedestal can be moved with the equipment installed thereon. For example, when semiconductor equipment is moved, the vibration control pedestal in accordance with the present invention can be moved with the semiconductor equipment. Therefore, it is possible to prevent the generation of particles, vibrations, and increased costs, which would otherwise result from a dismantlement of the already installed vibration control pedestal when the semiconductor equipment is moved.

While the invention has been shown and described with respect to the preferred embodiments, it will be understood by those skilled in the art that various changes and modifications may be made without departing from the spirit and scope of the invention as defined in the following claims.

What is claimed is:

1. A vibration control pedestal comprising:
a bottom structure comprising a plurality of support beams and an upper surface area; and
an equipment support body having at least two discrete equipment support cells, each of the at least two equipment support cells including a plurality of panels and a plurality of fences respectively disposed upright on and extending along the panels, wherein the panels and the fences define an inner space for receiving a concrete casting;
a first partition wall dividing the inner space into two parts in a widthwise direction;
a second partition wall dividing the inner space into two parts in a lengthwise direction perpendicularly to the widthwise direction;
a first cell connection units laterally passing through first two of the panels and the first partition walls in the widthwise direction; and
a second cell connection units laterally passing through the other two of the panels and the second partition walls in the lengthwise direction,
wherein cell connection units couple the equipment support cells to each other side-by-side atop the bottom structure, and the support beams are arranged to support the at least two equipment support cells.

2. The vibration control pedestal according to claim 1, wherein the upper surface area is equal to at least the total surface area of the at least two equipment support cells.

3. The vibration control pedestal according to claim 1, wherein each of the panels and partition walls include at least one hole that passes laterally therethrough from one of said sides to another.

4. The vibration control pedestal according to claim 3, wherein each of the equipment support cells includes at least two connection pipe that extends laterally passing through the holes.

5. The vibration control pedestal according to claim 4, wherein the at least one hole of each of the equipment support cells includes a first hole extending in the widthwise direction, and a second hole extending in the lengthwise direction, and the connection pipe comprises a first connection pipe passing through the panels and the partition walls in the widthwise direction, and a second connection pipe passing through the panels and the partition walls in the lengthwise direction.

6. The vibration control pedestal according to claim 4, wherein each of the cell connection units includes at least one rod, each said rod sized to extend through the connection pipes.

7. The vibration control pedestal according to claim 6, wherein each said rod has threads at ends thereof, and the at least one cell connection unit comprises at least one nut, each said nut having internal threads that receive threads at an end of a said rod.

8. The vibration control pedestal according to claim 1, wherein each of the equipment support cells includes at least one insert pipe extending vertically therethrough, and a fixing bolt sized to pass through each said insert pipe, whereby each of said equipment support cells can be detachably fixed to the bottom structure.

9. The vibration control pedestal according to claim 1, wherein the fences project above the partition walls.

10. The vibration control pedestal according to claim 1, wherein the support beams include a first support beams extending parallel to one another in a vertical direction, a second support beams disposed perpendicular to the first support beams, and fastening members fastening the first support beams to the second support beams.

11. The vibration control pedestal according to claim 1, wherein each of the equipment support cells includes brackets extending laterally outwardly from a bottom portion of the panels, the brackets having bolt holes extending vertically therethrough.

12. The vibration control pedestal according to claim 1, wherein each of the equipment support cells includes a sealing plate closing the bottom the panels, and the concrete casting sits on the sealing plate.

13. The vibration control pedestal according to claim 1, wherein the four panels have four intersections on corners of the rectangle.

* * * * *